(12) United States Patent
Yeh et al.

(10) Patent No.: US 9,136,008 B1
(45) Date of Patent: Sep. 15, 2015

(54) FLASH MEMORY APPARATUS AND DATA READING METHOD THEREOF

(71) Applicant: Winbond Electronics Corp., Taichung (TW)

(72) Inventors: Jun-Lin Yeh, Hsinchu County (TW); Shang-Wen Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/320,664

(22) Filed: Jul. 1, 2014

(51) Int. Cl.
*G11C 16/06* (2006.01)
*G11C 5/06* (2006.01)
*G11C 16/30* (2006.01)
*G11C 5/14* (2006.01)
*G11C 16/26* (2006.01)
*G11C 16/24* (2006.01)
*G11C 16/04* (2006.01)

(52) U.S. Cl.
CPC ............ *G11C 16/26* (2013.01); *G11C 16/0483* (2013.01); *G11C 16/24* (2013.01); *G11C 5/06* (2013.01); *G11C 5/063* (2013.01); *G11C 5/145* (2013.01); *G11C 16/06* (2013.01); *G11C 16/30* (2013.01)

(58) Field of Classification Search
CPC ........ G11C 16/30; G11C 16/06; G11C 5/145; G11C 5/06; G11C 5/063
USPC .......................... 365/185.05, 185.25, 185.23
See application file for complete search history.

(56) References Cited

U.S. PATENT DOCUMENTS

| | | | | |
|---|---|---|---|---|
| RE37,419 E | * | 10/2001 | Hsu et al. | 365/185.11 |
| 2006/0255768 A1 | * | 11/2006 | Yoshio | 320/134 |
| 2008/0239830 A1 | * | 10/2008 | Lee | 365/185.29 |
| 2008/0272434 A1 | * | 11/2008 | Park et al. | 257/347 |
| 2009/0244968 A1 | * | 10/2009 | Maejima | 365/185.03 |
| 2013/0308385 A1 | * | 11/2013 | Tanzawa | 365/185.17 |

* cited by examiner

*Primary Examiner* — Ly D Pham
(74) *Attorney, Agent, or Firm* — Jianq Chyun IP Office

(57) ABSTRACT

A flash memory apparatus and a data reading method thereof are provided. A boost voltage greater than a pre-charge voltage is provided to a gate of a source discharge transistor when a data reading operation is performed on a memory unit, so as to enhance discharge capability of the source discharge transistor.

8 Claims, 3 Drawing Sheets

FLASH MEMORY APPARATUS AND DATA READING METHOD THEREOF

BACKGROUND

1. Field of the Invention

The invention is directed to a memory apparatus and more particularly, to a flash memory apparatus and a data reading method thereof.

2. Description of Related Art

In a conventional flash memory array, memory cells are arranged in a rectangular array formed by rows and columns, and memory cell transistors are configured at intersections of the rows and the columns. In each transistor, a drain is connected to a corresponding bit line, a source is connected to a drain of an array source discharge transistor through an array source line, and a gate is connected to a word line.

A flash memory allows a programming, a reading or a erasing operation performed based on bulks, sectors or pages. Generally speaking, a memory cell has a metal oxide semiconductor (MOS) structure, and when a floating gate of the memory cell does not store any electric charge (i.e., when written data is "1"), the memory cell is normally on when performing a reading operation. When the floating gate stores electrons (i.e., when the written data is "0"), the memory cell is normally off when performing a reading operation.

When a reading operation is performed on the flash memory, a reading level of voltage is applied to a control gate of a selected memory cell, and a low level is applied to a drain bit line of a selected transistor. Whether the memory cell is turned on to a source line is determined according to a threshold voltage of the memory cell, and thereby, a level of the bit line is sensed, and data stored in the memory cell is determined. When the data stored in the memory cell is "1", a current appears on the bit line corresponding thereto. Generally, sources of the memory cells in the same page group of the flash memory array are connected in common to a source discharge transistor, and the current generated by reading the memory cells flows to a ground of the source discharge transistor. When most of the data stored in memory cells of the page group is "1", the size of the current flowing from the page group would probably exceed the maximum discharge current that the source discharge transistor can achieve. Thus, the size of the current flowing from the memory cells in the page group is limited, and as a result, correctness of interpreting data content stored in the memory cells and speed of reading the data will be affected.

SUMMARY

The invention provides a flash memory apparatus and a data reading method thereof capable of improving correctness of reading data content stored in the flash memory apparatus and a data reading speed.

The invention is directed to a flash memory apparatus, including a memory unit, a source discharge transistor, a pre-charge unit, a boost unit and a control unit. The memory unit includes a plurality of memory cells. A drain of the source discharge transistor is coupled to sources of the memory cells and a source of the source discharge transistor is coupled to a ground. The pre-charge unit is coupled to a gate of the source discharge transistor and controlled by the pre-charge control signal to stop providing a pre-charge voltage to the gate of the source discharge transistor when the memory unit performs a data reading operation. The boost unit is coupled to the gate of the source discharge transistor and provides a boost voltage to the gate of the source discharge transistor according to a boost voltage control signal after the pre-charge unit stops providing the pre-charge voltage. A level of the boost voltage is greater than a level of the pre-charge voltage. The control unit is coupled to the pre-charge unit and the boost unit and sends the pre-charge control signal and the boost voltage control signal according to a read command.

In an embodiment of the invention, the boost unit includes a capacitor unit and a switching unit. One terminal of the capacitor unit is coupled to the gate of the source discharge transistor. The switching unit is coupled to an operating voltage, the control unit, the ground and the other terminal of the capacitor unit, connects the operating voltage to the other terminal of the capacitor unit based on the boost voltage control signal when the memory unit performs the data reading, such that the capacitor unit provides the boost voltage to the gate of the source discharge transistor and connects the ground to the other terminal of the capacitor unit after the memory unit completes the data reading.

In an embodiment of the invention, the switching unit is a switch device.

In an embodiment of the invention, the switching unit includes an inverter, a P-type transistor and an N-type transistor. The inverter receives the boost voltage control signal. The P-type transistor and the N-type transistor are connected in series between the operating voltage and the ground. A gate of the N-type transistor and the P-type transistor is coupled to an output terminal of the inverter.

In an embodiment of the invention, the memory unit is a parallel flash memory.

The invention is directed to a data reading method of a flash memory apparatus. The flash memory apparatus includes a plurality of memory cells and a source discharge transistor, and the source discharge transistor is coupled between sources of the memory cells and a ground. The data reading method includes the follows steps. Whether a read command is received is detected. If the read command is received, the pre-charge voltage is stopped from being provided to a gate of the source discharge transistor. A boost voltage is provided to the gate of the source discharge transistor, and therein, a level of the boost voltage is greater than a level of the pre-charge voltage.

In an embodiment of the invention, the memory unit is a parallel flash memory.

To sum up, according to the embodiments of the invention, when the memory unit performs the data reading operation, the boost voltage having a greater level than the pre-charge voltage is provided to the source discharge transistor and thereby, discharge capability of the source discharge transistor can be enhanced, such that correctness of reading data content which is stored in the flash memory apparatus and data reading speed can be improved.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
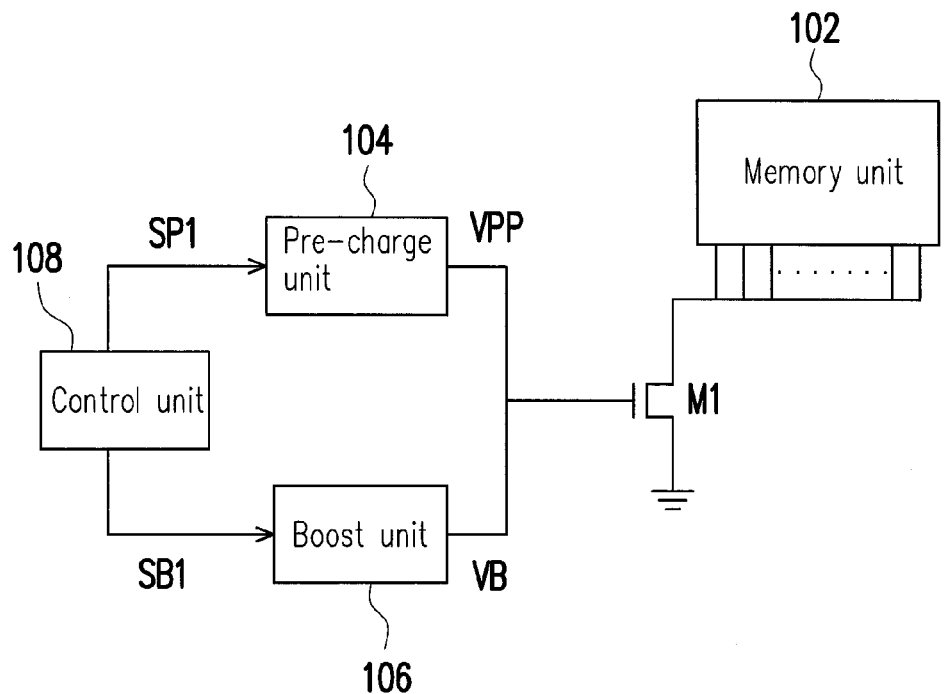
FIG. 1 is a schematic diagram illustrating a flash memory apparatus according to an embodiment of the invention.

FIG. 1 is a schematic diagram illustrating a flash memory apparatus according to an embodiment of the invention. Referring to FIG. 1, a flash memory apparatus includes a memory unit 102, a source discharge transistor M1, a pre-charge unit 104, a boost unit 106 and a control unit 108. The memory unit 102 may be, for example, a parallel flash memory, but the invention is not limited thereto. The memory unit 102 may include a plurality of memory cells (not shown). Sources of the memory cells may be connected to a drain of the source discharge transistor M1. For example, the sources of the memory cells in the same page group may be collectively connected to the drain of the source discharge transistor M1. A source of the source discharge transistor M1 is coupled to a ground, and a gate of the source discharge transistor M1 is coupled to the pre-charge unit 104 and the boost unit 106. Additionally, the control unit 108 is also coupled to the pre-charge unit 104 and the boost unit 106.

The pre-charge unit 104 serves to provide a pre-charge voltage VPP to the gate of the source discharge transistor M1, such that the source discharge transistor M1 is maintained in a certain turned-on degree to ensure that the source discharge transistor M1 would have a sufficient capability and a response speed for discharging when receiving a current from the memory unit 102. The control unit 108 may determine whether a read command is received and send a pre-charge control signal SP1 to the pre-charge unit 104 when receiving the read command so as to stop providing the pre-charge voltage VPP to the source discharge transistor M1. While sending the pre-charge control signal SP1 to the pre-charge unit 104 to stop providing the pre-charge voltage VPP to the source discharge transistor M1, the control unit 108 also sends a boost voltage control signal SB1 to the boost unit 106, such that the boost unit 106 sends a boost voltage VB having a level higher than the pre-charge voltage VPP to the gate of the source discharge transistor M1 in replacement with the pre-charge voltage VPP so as to raise the turned-on degree of the source discharge transistor M1 and improve the discharge capability of the source discharge transistor M1. By doing so, the memory cells in the page group may be prevented from affecting the correctness of reading the data content stored in the flash memory apparatus and the reading speed of interpreting data due to the size of the current flew therefrom being limited.

Figure 2:
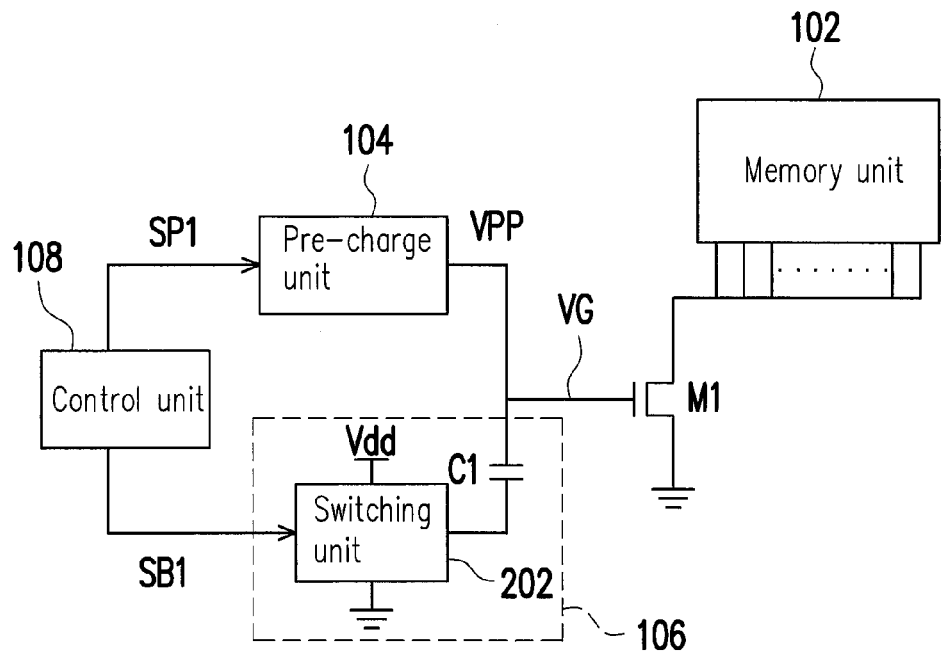
FIG. 2 is a schematic diagram illustrating a flash memory apparatus according to another embodiment of the invention.

FIG. 2 is a schematic diagram illustrating a flash memory apparatus according to another embodiment of the invention. Referring to FIG. 2, in the present embodiment, the boost unit 106 of the flash memory apparatus may include a capacitor unit C1 and a switching unit 202. The capacitor unit C1 is coupled between an output terminal coupled to the switching unit 202 and the gate of the source discharge transistor M1, and the switching unit 202 is further coupled to the control unit 108, an operating voltage Vdd and the ground.

Figure 3:
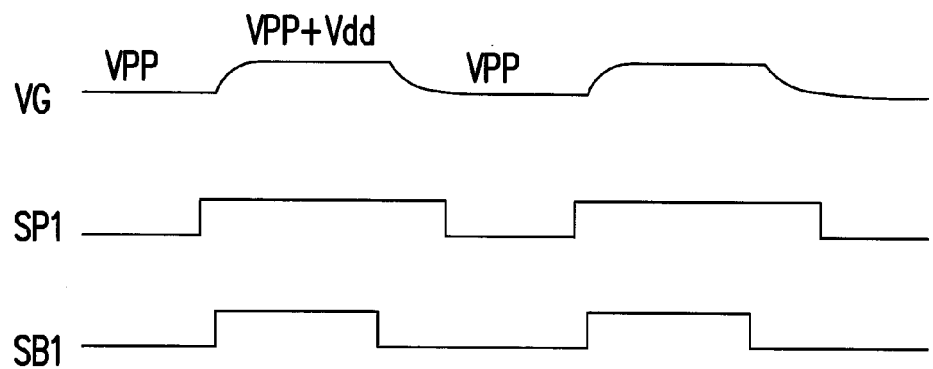
FIG. 3 is a schematic diagram illustrating waveforms of a gate voltage of the source discharge transistor, the pre-charge control signal and the boost voltage control signal of the embodiment illustrated in FIG. 2.

FIG. 3 is a schematic diagram illustrating waveforms of a gate voltage VG of the source discharge transistor M1, the pre-charge control signal SP1 and the boost voltage control signal SB1 of the embodiment illustrated in FIG. 2. Referring to FIG. 2 and FIG. 3 simultaneously, before the control unit 108 receives the read command, both the pre-charge control signal SP1 and the boost voltage control signal SB1 are at low voltage logic levels, such that the pre-charge unit 104 provides the pre-charge voltage VPP to the gate of the source discharge transistor M1, charges the capacitor unit C1 at the same time and thereby, the switching unit 202 couples the capacitor unit C1 to the ground. In this case, due to the switching unit 202 coupling the capacitor unit C1 to the ground, a voltage drop of the capacitor unit C1 is equal to that of the pre-charge voltage VPP.

When receiving the read command, the control unit 108 converts the pre-charge control signal SP1 into a high voltage logic level, such that the pre-charge unit 104 stops providing the pre-charge voltage VPP to the gate of the source discharge transistor M1. The control unit 108 then converts the boost voltage control signal SB1 into a high voltage logic level to control the switching unit 202 to couple the capacitor unit C1 to the operating voltage Vdd, and thereby, the voltage drop of the capacitor unit C1 is raised up to a voltage which is equal to pre-charge voltage VPP plus the operating voltage Vdd in a short time. Namely, a voltage level of the gate voltage VG of the source discharge transistor M1 becomes VPP+Vdd, such that the discharge capability of the source discharge transistor M1 is transiently increased.

After the reading operation of the memory unit 102 is completed, the control unit 108 converts the boost voltage control signal SB1 back to the low voltage logic level (i.e., the control unit 108 controls the switching unit 202 to couple the capacitor unit C1 back to the ground) and then converts the pre-charge control signal SP1 back to the low voltage logic level, such that the pre-charge unit 104 continue to provide the pre-charge voltage VPP to and charge the capacitor unit C1. In this way, the voltage drop (i.e., the gate voltage VG of the source discharge transistor M1) on the capacitor unit C1 returns to the voltage level of the pre-charge voltage VPP is a short time.

Figure 4:
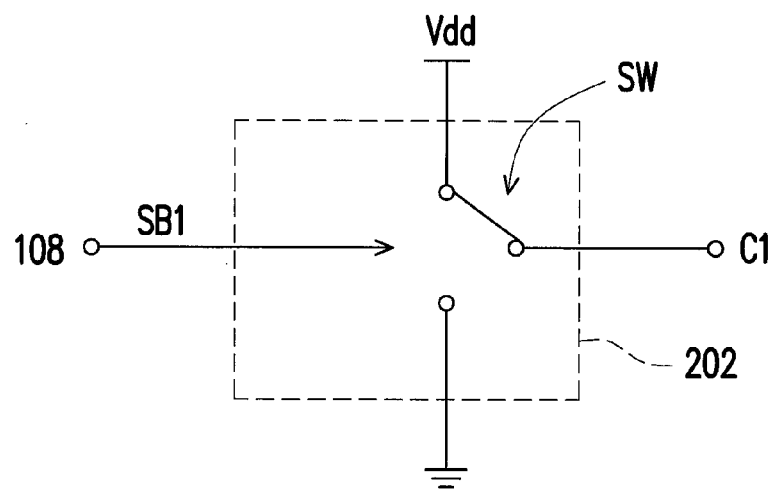
FIG. 4 and FIG. 5 are schematic diagrams illustrating the switching unit according to the embodiment of the invention.
Figure 5:
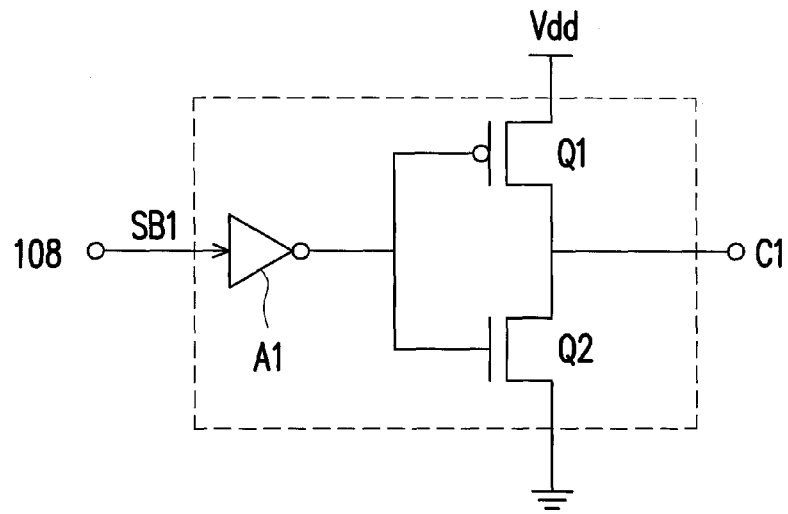

To be detailed, the switching unit 202 may be implemented in a manner of the embodiment illustrated in FIG. 4 or FIG. 5. In FIG. 4, the switching unit 202 is a switch device SW controlled by the boost voltage control signal SB1 to switch the connection of the capacitor unit C1 to the operating voltage Vdd or the ground. In FIG. 5, the switching unit 202 may include an inverter A1, a P-type transistor Q1 and an N-type transistor Q2. The P-type transistor Q1 and the N-type transistor Q2 are connected in series between the operating voltage Vdd and the ground. Gates of the P-type transistor Q1 and the N-type transistor Q2 are coupled to an output terminal of the inverter A1, while an input terminal of the inverter A1 is coupled to the control unit 108. When the boost voltage control signal SB1 output by the control unit 108 is in a low voltage logic level, and a voltage output by the inverter A1 is in a high voltage logic level, the P-type transistor Q1 is turned off, and the N-type transistor Q2 turned on. Thereby, the capacitor unit C1 is coupled to the ground through the N-type transistor Q2. On the other hand, when the boost voltage control signal SB1 output by the control unit 108 is in a high voltage logic level, and the voltage output by the inverter A1 is in a low voltage logic level, the P-type transistor Q1 is turned on, and the N-type transistor Q2 is turned off. Thereby, the capacitor unit C1 is coupled to the operating voltage Vdd through the P-type transistor Q1.

Figure 6:
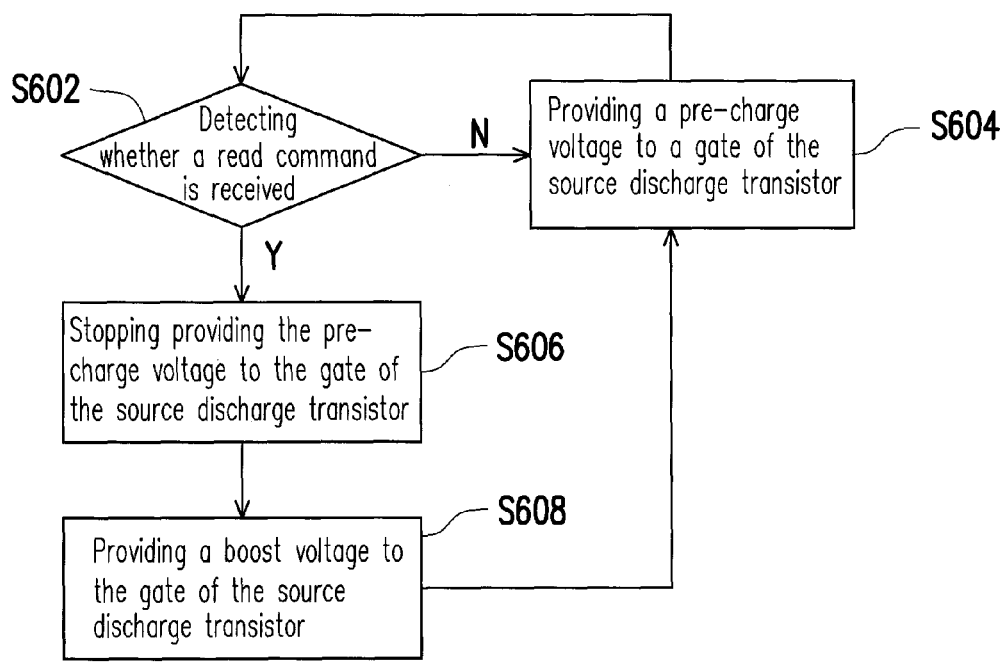
FIG. 6 is a schematic flowchart illustrating a data reading method of a flash memory apparatus according to an embodiment of the invention.

FIG. 6 is a schematic flowchart illustrating a data reading method of a flash memory apparatus according to an embodiment of the invention. Referring to FIG. 6. In summary of the foregoing, the data reading method of the flash memory apparatus may include the following steps. First, whether a read command is received is detected (step S602). If the read command is not received, a pre-charge voltage is provided to the gate of the source discharge transistor (step S604), step S602 is returned to and whether the read command is received is continuously detected. Otherwise, if the read command is received, the pre-charge voltage is stopped from being provided to the gate of the source discharge transistor (step S606), and then, a boost voltage is provided to the gate of the source discharge transistor (step S608). A voltage level of the boost voltage is greater than a voltage level of the pre-charge voltage. Additionally, when the execution of the read command is completed, step S604 is returned to, and the voltage provided to the gate of the source discharge transistor is switched back to the pre-charge voltage from the boost voltage.

Based on the above, in the invention, when the memory unit performs the data reading operation, the boost voltage having a voltage level higher than that of the pre-charge voltage is provided to enhance the discharge capability of the source discharge transistor, such that the memory cells in the page group can be prevented from affecting the correctness of reading the data content stored in the flash memory apparatus and the reading speed of interpreting data due to the size of the current flew from the memory cells being limited.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A flash memory apparatus, comprising:
   a memory unit, comprising a plurality of memory cells;
   a source discharge transistor, having a drain coupled to sources of the memory cells and having a source coupled to a ground;
   a pre-charge unit, coupled to a gate of the source discharge transistor and controlled by a pre-charge control signal to stop providing a pre-charge voltage to the gate of the source discharge transistor when the memory unit performs a data reading operation;
   a boost unit, coupled to the gate of the source discharge transistor and providing a boost voltage to the gate of the source discharge transistor according to a boost voltage control signal after the pre-charge unit stops providing the pre-charge voltage, wherein a level of the boost voltage is greater than a level of the pre-charge voltage; and
   a control unit, coupled to the pre-charge unit and the boost unit and sending the pre-charge control signal and the boost voltage control signal according to a read command.

2. The flash memory apparatus according to claim 1, wherein the boost unit comprises:
   a capacitor unit, having one terminal coupled to the gate of the source discharge transistor; and
   a switching unit, coupled to an operating voltage, the control unit, the ground and the other terminal of the capacitor unit, connecting the operating voltage to the other terminal of the capacitor unit based on the boost voltage control signal when the memory unit performs the data reading, such that the capacitor unit provides the boost voltage to the gate of the source discharge transistor and connecting the ground to the other terminal of the capacitor unit after the memory unit completes the data reading.

3. The flash memory apparatus according to claim 2, wherein the switching unit includes a switch device.

4. The flash memory apparatus according to claim 2, wherein the switching unit comprises:
   a inverter, receiving the boost voltage control signal;
   a P-type transistor; and
   an N-type transistor, connected in series with the P-type transistor between the operating voltage and the ground, wherein a gate of the N-type transistor and the P-type transistor is coupled to an output terminal of the inverter.

5. The flash memory apparatus according to claim 1, wherein the memory unit includes a parallel flash memory.

6. A data reading method of a flash memory apparatus, wherein the flash memory apparatus comprises a plurality of memory cells and a source discharge transistor, the source discharge transistor is coupled between sources of the memory cells and a ground, the data reading method comprising:
   detecting whether a read command is received;
   if the read command is received, stopping providing a pre-charge voltage to a gate of the source discharge transistor; and
   providing a boost voltage to the gate of the source discharge transistor, wherein a level of the boost voltage is greater than a level of the pre-charge voltage.

7. The method according to claim 6, further comprising:
   after execution of the read command is completed, providing the pre-charge voltage to the gate of the source discharge transistor.

8. The method according to claim 6, wherein the memory unit is a parallel flash memory.

* * * * *